United States Patent [19]
Barrett, Jr. et al.

[11] Patent Number: 5,789,973
[45] Date of Patent: Aug. 4, 1998

[54] RESISTORLESS OPERATIONAL TRANSCONDUCTANCE AMPLIFIER CIRCUIT

[75] Inventors: Raymond L. Barrett, Jr., Ft. Lauderdale; Scott R. Humphreys, Boynton Beach; Barry W. Herold, Delray Beach, all of Fla.

[73] Assignee: Motorola, Inc., Schaumburg, Ill.

[21] Appl. No.: 707,673

[22] Filed: Sep. 4, 1996

[51] Int. Cl.$^6$ .................................................. H03F 3/45
[52] U.S. Cl. ............................. 327/561; 330/69; 330/85; 330/260
[58] Field of Search ..................... 330/85, 260, 252, 330/69, 293, 86; 327/563, 561, 560, 562

[56] References Cited

U.S. PATENT DOCUMENTS

| | | | |
|---|---|---|---|
| 4,013,975 | 3/1977 | Kataoka et al. | 330/86 |
| 4,771,196 | 9/1988 | Mead et al. | 327/277 |
| 4,851,718 | 7/1989 | Hagino et al. | 327/561 |
| 5,111,154 | 5/1992 | Nakagawara | 330/85 |
| 5,345,190 | 9/1994 | Kaylor | 330/258 |
| 5,357,208 | 10/1994 | Nelson | 327/335 |

*Primary Examiner*—Timothy P. Callahan
*Assistant Examiner*—Terry L. Englund
*Attorney, Agent, or Firm*—Gregg Rasor

[57] ABSTRACT

A resistorless amplifier circuit uses integrated operational transconductance amplifiers to realize a plurality of circuit transfer functions. The preferred embodiment produces an output signal voltage $V_{out}$ (500) that is either $g_{m1}/g_{m3}$ or $g_{m1}/(g_{m3}-g_{m1})$ times the input signal voltage $V_{in}$ (400). Additionally, an alternative embodiment implements a resistorless summing and subtracting operational transconductance amplifier circuit that realizes an output signal voltage as follows:

$$V_{out} = V_{ref} + \frac{1}{g_{m3}} \left[ \sum_{j=1}^{m} g_{mj}(V_j - V_{ref}) - \sum_{k=1}^{n} g_{mk}(V_k - V_{ref}) \right].$$

The resistorless amplifier circuit includes a first operational transconductance amplifier (100) with a transconductance $g_{m1}$, a second operational transconductance amplifier (200) with a transconductance $g_{m2}$, and a third operational transconductance amplifier (300) with a transconductance $g_{m3}$.

7 Claims, 4 Drawing Sheets

RESISTORLESS OPERATIONAL TRANSCONDUCTANCE AMPLIFIER CIRCUIT

FIELD OF THE INVENTION

This invention relates in general to integrated electronic circuits and more particularly to an integrated resistorless amplifier circuit using integrated operational transconductance amplifiers.

BACKGROUND OF THE INVENTION

In portable battery operated products such as a selective call receiver or the like, integrated circuits have become commonplace as a way of reducing overall device power consumption. Over the last several years, manufacturers have shifted from low-power bipolar integrated circuit (IC) designs to BI-CMOS and CMOS based components. This shift resulted in system power savings of 2 to 100 times, and a corresponding increase in battery life. However, the use of CMOS processing with small geometries (generally 1.0 micron or less) created problems with implementing certain basic circuit functions.

These functions and their required components will be discussed later.

As one of ordinary skill in the art of analog circuit design will appreciate, a typical voltage controlled voltage source op-amp is generally designed to realize several parameters: maximum input impedance, minimum output impedance, high open loop gain, and a reasonable gain-bandwidth product over which the op-amp is usable. Moreover, a general op-amp uses a balanced differential input topology. This op-amp topology operates to eliminate any imbalance or difference in signals present at the input terminals by either increasing or decreasing the output drive. Using these properties, circuit designers are able to synthesize many electrical circuits such as amplifiers, filters, and oscillators.

When using the typical voltage controlled voltage source op-amp in an integrated circuit, especially a CMOS integrated circuit, several problems may be encountered. First, input DC offsets are always a problem, and result in extremely critical bias requirements for the differential input stage. This complicates the design and increases the overall power consumption of the op-amp. Second, in order to achieve a consistently low output impedance over a specified operating range, higher currents must be used in the output stage of the op-amp. Again, this increases the overall power consumption of the op-amp. Third, if high gains are to realized, the ratio of resistor values, which primarily sets the circuit's voltage gain, must be high. This is really the crux of the problem, since realizing large resistors (1 MΩ or greater) in a 0.5 micron CMOS process results in huge components, dwarfing the size of the amplifier circuitry, increasing the circuit's temperature variability, and essentially destroying any benefit associated with the small size, low power, and low cost of CMOS process integrated circuits.

Thus, what is needed is a topology that implements an extremely small power efficient amplifier without the use of resistors.

DESCRIPTION OF A PREFERRED EMBODIMENT

Figure 1:
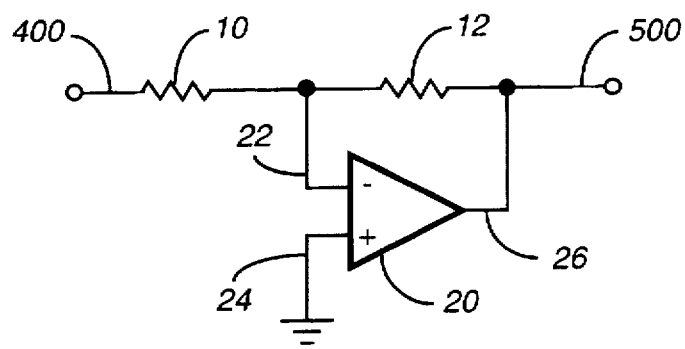
FIG. 1 is a schematic diagram of a prior art inverting op-amp circuit.

Referring to FIG. 1, consider the case of a prior art inverting operational amplifier circuit. This topology may be realized using a conventional op-amp 20 such as a 741 or the like, and external resistors 10, 12 such as manufactured from carbon composition or metal film. Assuming a high open loop gain (typically >100,000), this circuit operates to amplify or attenuate an input signal 400 by a factor of $R_2$ 12 divided by $R_1$ 10, and to invert the phase relative to the input signal, producing an output signal 500. The typical op-amp 20 shown in FIG. 1 includes an inverting input terminal 22, a non-inverting input terminal 24, and an output terminal 26.

Now consider that a gain of 40 dB (20 $\log_{10}(100)$) is required. This yields a ratio of 100:1, or by example, an $R_2$ 12 value of 10 MΩ and an $R_1$ 10 value of 100 KΩ. In a typical CMOS process with resistor values of 2 KΩ/square, a 10 MΩ resistor is nominally 100,000μ long and 20μ wide, wrapped using a 20μ spacing, occupying a typical area of approximately 4,000,000 square R units. The circuitry for the amplifier, including a differential input stage, DC biasing, and output stage, occupies a typical area of only 1200 square units. One of ordinary skill in the art can plainly see that resistors occupy a much greater area of a die than the amplifiers. Accordingly, since a primary factor in determining the cost of a die is the area occupied by each individual integrated circuit, it is extremely advantageous to minimize the circuit size by eliminating large integrated components such as resistors and capacitors.

Figure 2:
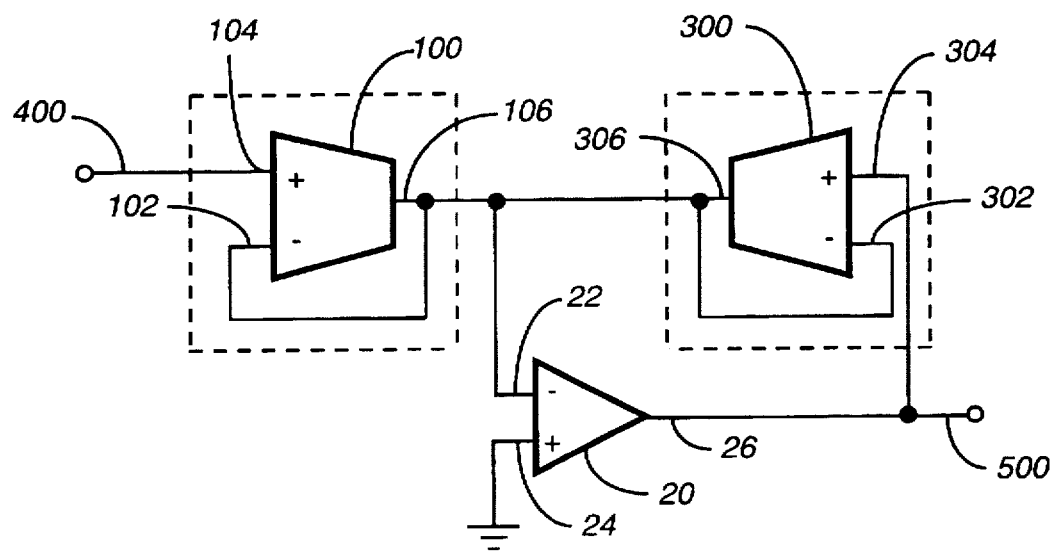
FIG. 2 is a prototype schematic diagram of an improved resistorless inverting op-amp circuit.

Referring to FIG. 2, the illustration shows a prototype schematic diagram of an improved resistorless inverting op-amp circuit. This circuit represents a first step in synthesizing a resistorless topology that replaces the function implemented by the conventional op-amp illustrated in FIG. 1.

In FIG. 2, resistors $R_1$ 10 and $R_2$ 12 are replaced by operational transconductance amplifiers (OTAs) denoted as 100 and 300, respectively. OTA$_1$ 100 includes an inverting input terminal 102, a non-inverting input terminal 104, and an output terminal 106. Similarly, the OTA$_3$ 300 includes an inverting input terminal 302, a non-inverting input terminal 304, and an output terminal 306.

The general transfer characteristic of an OTA can be described by the following relationship: $i_{out}=V_{in} g_m$ where $i_{out}$ is the output current, $V_{in}$ is the input voltage, and $g_m$ is the transconductance associated with the OTA. By using this relationship, one can replace the currents generated through resistors $R_1$ 10 and $R_2$ 12 of FIG. 1 with corresponding currents generated by OTA$_1$ 100 and OTA$_3$ 300 as a function of the input and output voltages present at the respective terminals of each OTA, and their selected $g_m$ values. Theoretically, this circuit will yield equivalent operational results when compared with the op-amp in FIG. 1, but will typically occupy only one thousandth (1/1000) as much area on an integrated circuit.

Typical $g_m$ values for a preferred CMOS process are 50–100 nA/volt, which yields effective resistors in the range of 10 MΩ. As one of ordinary skill in the art will appreciate, a 10 MΩ resistor is clearly impractical to fabricate in a 0.5 to 1.0 micron CMOS process, and still have an affordable integrated circuit. Accordingly, the approach shown in FIG. 2 is a viable resistorless alternative available to a designer. However, the exact topology illustrated in FIG. 2 is not optimal, since referencing the differential follower inputs 102, 302 to the respective outputs 106, 306 creates an amplifier slew rate problem because of the capacitances associated with the output drivers and input stages.

Moreover, the use of a conventional op-amp 20 presents an unnecessary low impedance at the input 304 of $OTA_3$ 300. As will be discussed with reference to FIGS. 3 and 4, the preferred embodiment of the present invention uses an operational transconductance amplifier $OTA_2$ 200 in the place of the conventional op-amp 20.

Figure 3:
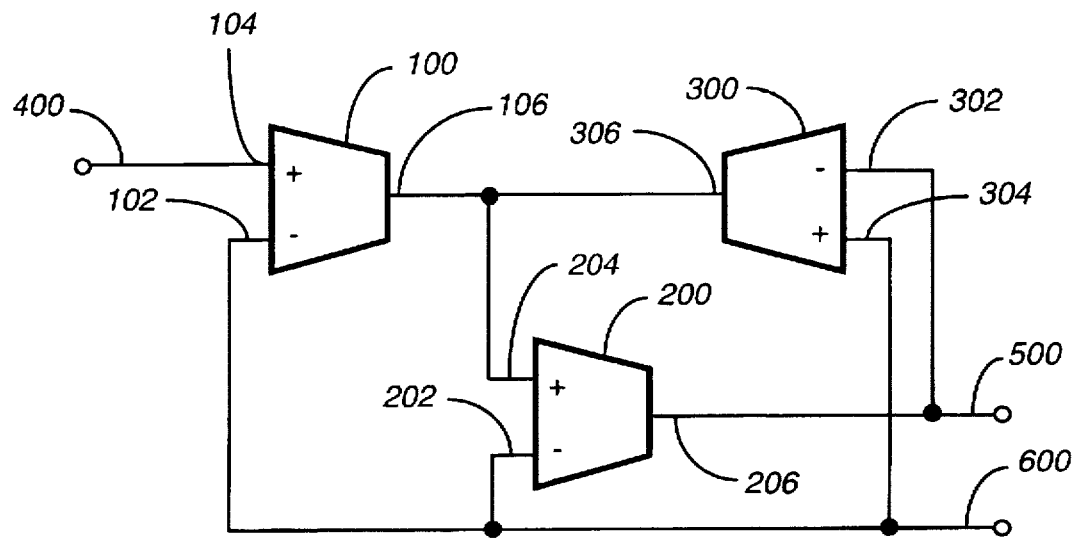
FIG. 3 is a schematic diagram of an improved resistorless non-inverting operational transconductance amplifier circuit.
Figure 4:
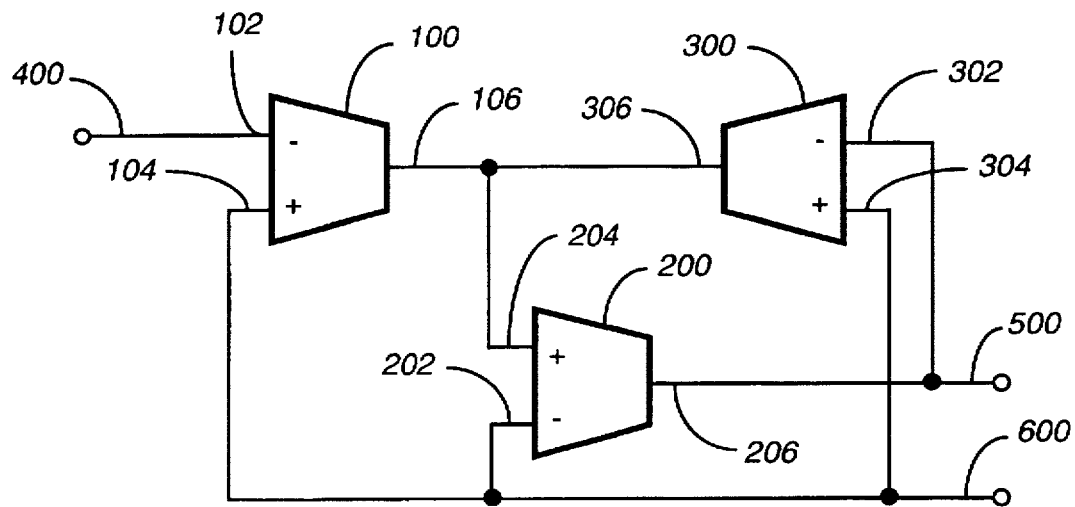
FIG. 4 is a schematic diagram of an improved resistorless inverting operational transconductance amplifier circuit.

Referring to FIGS. 3 and 4, the schematic diagrams illustrate improved circuit topologies of resistorless non-inverting and inverting amplifier operational transconductance amplifier circuits, respectively.

A first operational transconductance amplifier $OTA_1$ 100 has an associated transconductance $g_{m1}$, a first inverting input terminal 102, a first non-inverting input terminal 104, and a first output terminal 106. A second operational transconductance amplifier $OTA_2$ 200 has an associated transconductance $g_{m2}$, a second inverting input terminal 202, a second non-inverting input terminal 204, and a second output terminal 206. The first output terminal 106 of the first operational transconductance amplifier $OTA_1$ 100 is coupled to the second non-inverting input terminal 204 of the second operational transconductance amplifier $OTA_2$ 200, and the second inverting input terminal 202 of the second operational transconductance amplifier is coupled to a reference voltage 600. A third operational transconductance amplifier $OTA_3$ 300 has an associated transconductance $g_{m3}$, a third inverting input terminal 302, a third non-inverting input terminal 304, and a third output terminal 306.

The second output terminal 206 of the second operational transconductance amplifier $OTA_2$ 200 is coupled to the third inverting input terminal 302 of the third operational transconductance amplifier $OTA_3$ 300. The third output terminal 306 of the third operational transconductance amplifier $OTA_3$ 300 is coupled to the first output terminal 106 of the first operational transconductance amplifier $OTA_1$ 100 and the second non-inverting input terminal 204 of the second operational transconductance amplifier $OTA_2$ 200. Finally, the third non-inverting input terminal 304 of the third operational transconductance amplifier $OTA_3$ 300 is coupled to the reference voltage 600.

When an input signal 400 is applied to the first operational transconductance amplifier $OTA_1$ 100, an output signal 500 is produced at the second output terminal 206 of the second operational transconductance amplifier $OTA_2$ 200 with an amplitude $g_{m1}/g_{m3}$ times the input signal 400. This result follows directly from the previous substitution discussed in reference to FIG. 2, since the "effective" resistors formed using the first operational transconductance amplifier $OTA_1$ 100 and the third operational transconductance amplifier $OTA_3$ 300 are $r_1 = 1/g_{m1}$ and $r_2 = 1/g_{m3}$, respectively, and the ratio of $r_2/r_1$ equals $g_{m1}/g_{m3}$.

In the non-inverting embodiment illustrated in FIG. 3, the input signal $V_{in}$ 400 is a voltage difference between the first non-inverting input terminal 104 and the first inverting input terminal 102 of the first operational transconductance amplifier $OTA_1$ 100. Moreover, the first inverting input terminal 102 is coupled to the reference voltage $V_{ref}$ 600, and the non-inverting embodiment of the resistorless amplifier circuit generates the output signal $V_{out}$ 500 with the amplitude $g_{m1}/g_{m3}$ times the input signal $V_{in}$ 400 and non-inverted phase.

Referring to FIG. 4, note that the circuit topology illustrated in therein is identical to that illustrated in FIG. 3, except that the first operational transconductance amplifier $OTA_1$ 100 is "flipped." More particularly, the input signal $V_{in}$ 400 is a voltage difference between the first inverting input terminal 102 and the first non-inverting input terminal 104 of the first operational transconductance amplifier $OTA_1$ 100. The first non-inverting input terminal 104 is coupled to the reference voltage $V_{ref}$ 600, and the resistorless amplifier circuit generates the output signal $V_{out}$ 500 with the amplitude $g_{m1}/g_{m3}$ times the input signal $V_{in}$ 400 and inverted phase.

Figure 5:
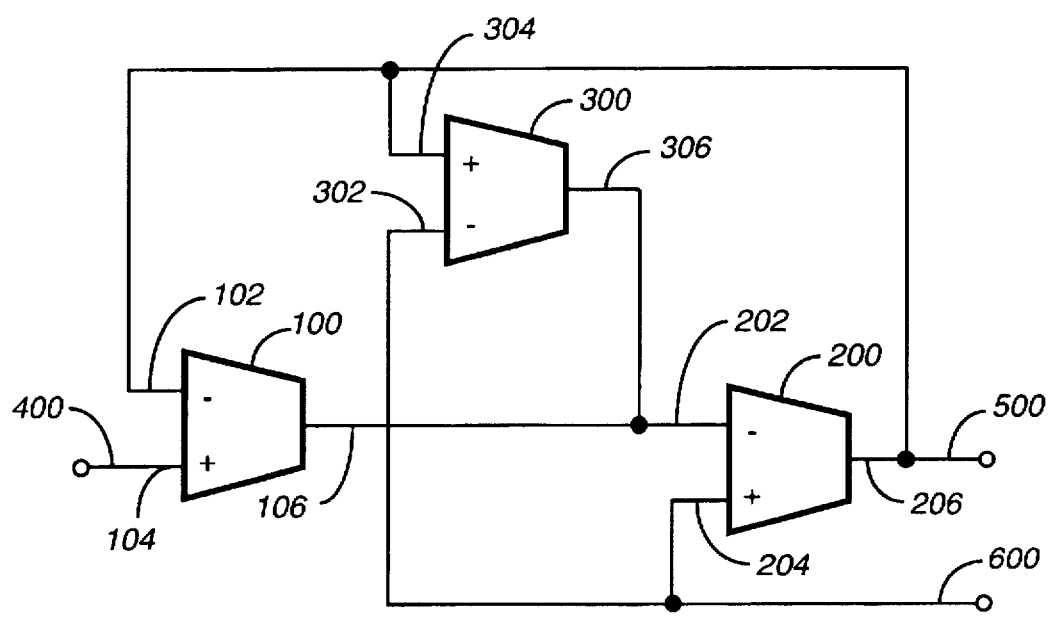
FIG. 5 is a schematic diagram of an improved resistorless inverting operational transconductance amplifier circuit in accordance with a preferred embodiment of the present invention.

Referring to FIG. 5, the schematic diagram shows an improved resistorless inverting operational transconductance amplifier circuit in accordance with a preferred embodiment of the present invention.

As with the operational transconductance amplifiers discussed in reference to FIGS. 3 and 4, each of the first 100, second 200, and third 300 OTAs have respective inverting and non-inverting input terminals, an output terminal, and independent transconductance values $g_{m1}$, $g_{m2}$, and $g_{m3}$.

The first output terminal 106 of the first operational transconductance amplifier $OTA_1$ 100 is coupled to the second inverting input terminal 202 of the second operational transconductance amplifier $OTA_2$ 200. The second non-inverting input terminal 204 of the second operational transconductance amplifier is coupled to the reference voltage 600. The second output terminal 206 of the second operational transconductance amplifier $OTA_2$ 200 is coupled to the third non-inverting input terminal 304 of the third operational transconductance amplifier $OTA_3$ 300 and the first inverting input terminal 102 of the first operational transconductance amplifier $OTA_1$ 100. The third output terminal 306 of the third operational transconductance amplifier $OTA_3$ 300 is coupled to the first output terminal 106 of the first operational transconductance amplifier $OTA_1$ 100 and the second inverting input terminal 202 of the second operational transconductance amplifier $OTA_2$ 200. The third inverting input terminal 302 of the third operational transconductance amplifier $OTA_3$ 300 is coupled to the reference voltage 600.

When an input signal 400 is applied to the first operational transconductance amplifier $OTA_1$ 100, an output signal 500 is produced at the second output terminal 206 of the second operational transconductance amplifier $OTA_2$ 200 with an amplitude $g_{m1}/(g_{m3}-g_{m1})$ times the input signal 400 and inverted phase. The input signal 400 is a voltage difference between the first non-inverting input terminal 104 and the reference voltage 600.

Using the gain relationship of $g_{m1}/(g_{m3}-g_{m1})$, the operational transconductance amplifier circuit shown in FIG. 5 can realize substantial magnitudes of voltage gain if the difference $(g_{m3}-g_{m1})$ is small relative to $g_{m1}$, or if $g_{m3}$ is nearly equal to $g_{m1}$. By contrast, the operational transconductance amplifier circuits illustrated in FIGS. 3 and 4 can only achieve substantial gain when $g_{m1}$ is much larger than $g_{m3}$.

For practical OTA circuits, it is difficult enough to linearize the transconductance of the OTA over a reasonably large input range, but this difficulty is compounded if the linearity is to be maintained over a wide range of transconductances. The apparatus disclosed herein allows high gain while preserving the process and temperature independence of the transconductance ratioed design.

Referring again to FIG. 5, one of ordinary skill in the art will appreciate that an alternate embodiment of the improved resistorless inverting operational transconductance amplifier shown can be realized by reversing or swapping a polarity associated with each of the first inverting input terminal 102, the first non-inverting input terminal 104, the second inverting input terminal 202, the second non-inverting input terminal 204, the third inverting input terminal 302, and the third non-inverting input terminal 304, resulting in a dual resistorless amplifier circuit with overall operating characteristics substantially similar to that discussed in reference to FIG. 5.

As with FIG. 5, the dual circuit amplifies an input signal 400 applied to the first operational transconductance amplifier $OTA_1$ 100, to produce an output signal 500 at the second output terminal 206 of the second operational transconductance amplifier $OTA_2$ 200 with an amplitude $g_{m1}/(g_{m3}-g_{m1})$ times the input signal 400 and inverted phase. However, in the dual circuit, the input signal 400 is a voltage difference between the first inverting input terminal 102 and the reference voltage 600.

Figure 6:
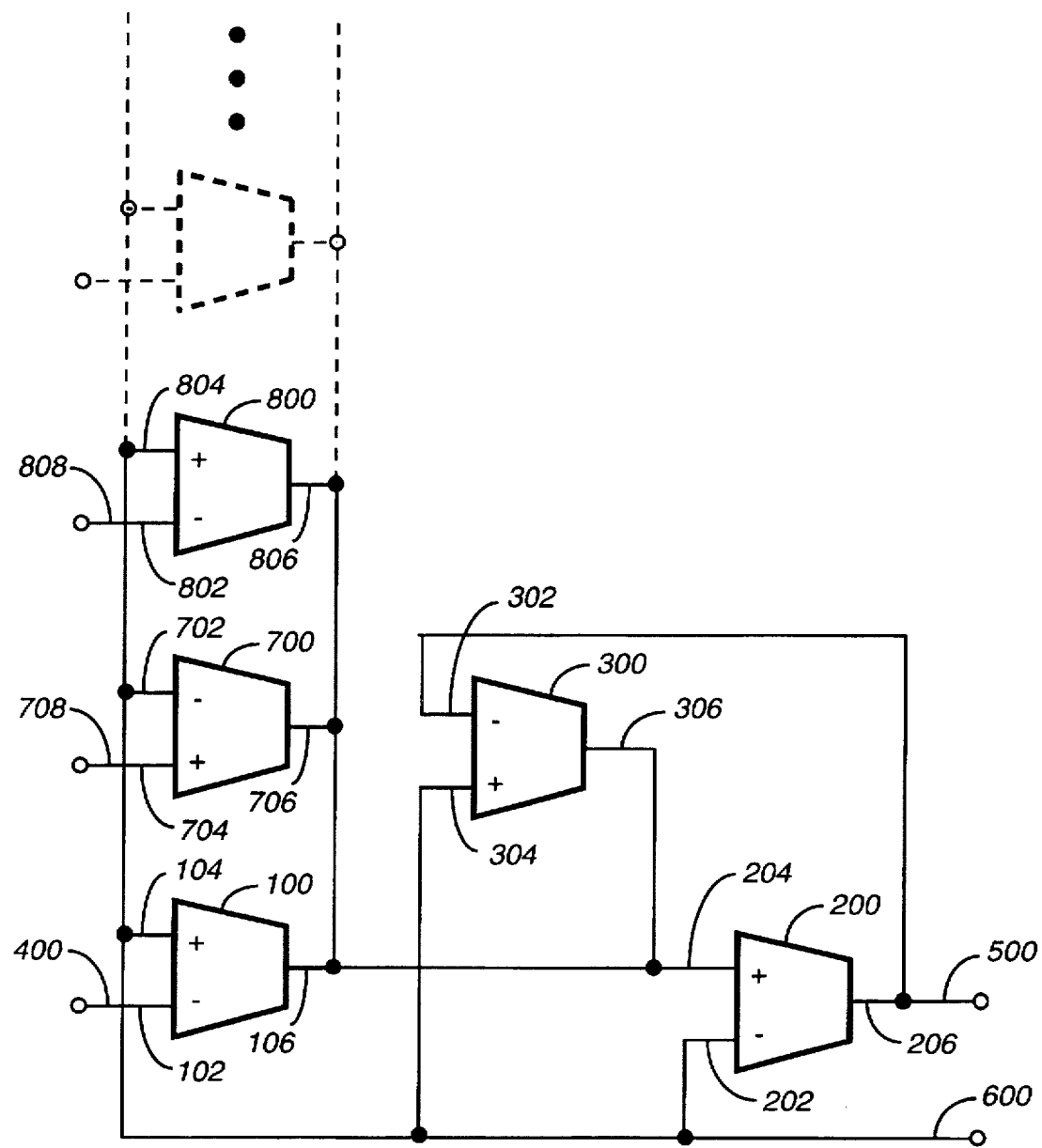
FIG. 6 is a schematic diagram of an improved resistorless summing and subtracting operational transconductance amplifier circuit in accordance with a preferred embodiment of the present invention.

Referring to FIG. 6, the schematic diagram shows an improved resistorless summing and subtracting operational transconductance amplifier circuit in accordance with a preferred embodiment of the present invention.

In this embodiment, the basic improved circuit topologies of the resistorless non-inverting and inverting amplifier operational transconductance amplifier circuits shown in FIGS. 3 and 4 may be modified by paralleling additional input operational transconductance amplifiers with the first operational transconductance amplifier $OTA_1$ 100. The resulting circuit includes at least a jth of n subtracting operational transconductance amplifier(s) 700 having a transconductance $g_{mj}$, a jth inverting input terminal 702, a jth non-inverting input terminal 704 coupled to a jth input voltage $V_j$, and a jth output terminal 706. The jth inverting input terminal 702 is coupled to the reference voltage $V_{ref}$ 600. The jth output terminal 706 is coupled to the third output terminal 306 of the third operational transconductance amplifier 300 and the second non-inverting input terminal 204 of the second operational transconductance amplifier 200.

Similarly, by paralleling at least a kth summing operational transconductance amplifier 800 having a transconductance $g_{mk}$, a kth inverting input terminal 802 coupled to a kth input voltage $V_k$, a kth non-inverting input terminal 804, and a kth output terminal 806 with the first operational transconductance amplifier $OTA_1$ 100, a summing function is achieved. The kth non-inverting input terminal 804 is coupled to the reference voltage $V_{ref}$ 600. The kth output terminal 806 is coupled to the third output terminal 306 of the third operational transconductance amplifier 300 and the second non-inverting input terminal 204 of the second operational transconductance amplifier 200.

The resistorless amplifier circuit shown in FIG. 6 generates the output signal $V_{out}$ 500 according to a relation:

$$V_{out} = V_{ref} + \frac{1}{g_{m3}} \left[ \sum_{j=1}^{m} g_{mj}(V_j - V_{ref}) - \sum_{k=1}^{n} g_{mk}(V_k - V_{ref}) \right],$$

where m is a number of non-inverting operational transconductance amplifier input stages and n is a number of inverting operational transconductance amplifier input stages.

Note that each of the weighting constants for the summing and subtracting operational transconductance amplifier circuit are in the form of a ratio of transconductances. This particular form is advantageous because the transconductance is determined by the physical geometries of the devices, the current densities through them, and the process parameters. Since the ratio of transconductances can be set by the ratio of geometrical factors, current density ratios, and the process parameter dependent factors cancel between the numerator and denominator of each ratio, thus yielding a process insensitive design with excellent manufacturability.

Several voltage combining circuits have been modeled utilizing circuit design principles disclosed herein, which serve to linearize the transconductance of the OTAs employed. The results reflect a high degree of linearization using these designs, and practical implementations may be realized by holding the ratios to tolerances within ±5% over a linear range. This demonstrates the facility of combining voltage signals to within that tolerance.

Lastly, the ratios do not change with temperature or process, as they are geometric in nature.

What is claimed is:

1. A resistorless amplifier circuit using integrated operational transconductance amplifiers, comprising:
   a first operational transconductance amplifier having a transconductance $g_{m1}$, a first inverting input terminal, a first non-inverting input terminal, and a first output terminal;
   a second operational transconductance amplifier having a transconductance $g_{m2}$, a second inverting input terminal, a second non-inverting input terminal, and a second output terminal, the first output terminal being coupled to the second non-inverting input terminal, and the second inverting input terminal being coupled to a reference voltage $V_{ref}$; and
   a third operational transconductance amplifier having a transconductance $g_{m3}$, a third inverting input terminal, a third non-inverting input terminal, and a third output terminal, the second output terminal being coupled to the third inverting input terminal, the third output terminal being coupled to the first output terminal and the second non-inverting input terminal, and the third non-inverting input terminal being coupled to the reference voltage $V_{ref}$, wherein an input signal $V_{in}$ applied to the first operational transconductance amplifier results in an output signal $V_{out}$ at the second output terminal with an amplitude $g_{m1}/g_{m3}$ times the input signal $V_{in}$.

2. The resistorless amplifier circuit according to claim 1 wherein the input signal $V_{in}$ is a voltage difference between the first inverting input terminal and the first non-inverting input terminal of the first operational transconductance amplifier, the first non-inverting input terminal being coupled to the reference voltage $V_{ref}$, the resistorless amplifier circuit generating the output signal $V_{out}$ with the amplitude $g_{m1}/g_{m3}$ times the input signal $V_{in}$ and inverted phase.

3. The resistorless amplifier circuit according to claim 1 wherein the input signal $V_{in}$ is a voltage difference between the first non-inverting input terminal and the first inverting input terminal of the first operational transconductance amplifier, the first inverting input terminal being coupled to the reference voltage $V_{ref}$, the resistorless amplifier circuit generating the output signal $V_{out}$ with the amplitude $g_{m1}/g_{m3}$ times the input signal $V_{in}$ and non-inverted phase.

4. The resistorless amplifier circuit according to claim 1 further comprising:

at least a jth operational transconductance amplifier having a transconductance $g_{mj}$, a jth inverting input terminal, a jth non-inverting input terminal coupled to a jth input voltage $V_j$, and a jth output terminal, the jth inverting input terminal being coupled to the reference voltage $V_{ref}$, the jth output terminal being coupled to the third output terminal of the third operational transconductance amplifier and the second non-inverting input terminal of the second operational transconductance amplifier; and at least a kth operational transconductance amplifier having a transconductance $g_{mk}$, a kth inverting input terminal coupled to a kth input voltage $V_k$, a kth non-inverting input terminal, and a kth output terminal, the kth non-inverting input terminal being coupled to the reference voltage $V_{ref}$, the kth output terminal being coupled to the third output terminal of the third operational transconductance amplifier and the second non-inverting input terminal of the second operational transconductance amplifier, the resistorless amplifier circuit generating the output signal $V_{out}$ according to a relation:

$$V_{out} = V_{ref} + \frac{1}{g_{m3}} \left[ \sum_{j=1}^{m} g_{mj}(V_j - V_{ref}) - \sum_{k=1}^{n} g_{mk}(V_k - V_{ref}) \right],$$

where m is a positive integer representing a number of non-inverting operational transconductance amplifier input stages and n is a positive integer representing a number of inverting operational transconductance amplifier input stages.

5. A resistorless amplifier circuit using integrated operational transconductance amplifiers, comprising:

a first operational transconductance amplifier having a transconductance $g_{m1}$, a first inverting input terminal, a first non-inverting input terminal, and a first output terminal;

a second operational transconductance amplifier having a transconductance $g_{m2}$, a second inverting input terminal, a second non-inverting input terminal, and a second output terminal, the first output terminal of the first operational transconductance amplifier being coupled to the second non-inverting input terminal of the second operational transconductance amplifier, and the second inverting input terminal of the second operational transconductance amplifier being coupled to a reference voltage; and a third operational transconductance amplifier having a transconductance $g_{m3}$, a third inverting input terminal, a third non-inverting input terminal, and a third output terminal, the second output terminal of the second operational transconductance amplifier being coupled to the third inverting input terminal of the third operational transconductance amplifier, the third output terminal of the third operational transconductance amplifier being coupled to the first output terminal of the first operational transconductance amplifier and the second non-inverting input terminal of the second operational transconductance amplifier, and the third non-inverting input terminal of the third operational transconductance amplifier being coupled to the reference voltage, wherein an input signal applied to the first operational transconductance amplifier results in an output signal at the second output terminal of the second operational transconductance amplifier with an amplitude $g_{m1}/g_{m3}$ times the input signal.

6. A resistorless amplifier circuit using integrated operational transconductance amplifiers, comprising:

a first operational transconductance amplifier having a transconductance $g_{m1}$, a first inverting input terminal, a first non-inverting input terminal, and a first output terminal;

a second operational transconductance amplifier having a transconductance $g_{m2}$, a second inverting input terminal, a second non-inverting input terminal, and a second output terminal, the first output terminal of the first operational transconductance amplifier being coupled to the second inverting input terminal of the second operational transconductance amplifier, and the second non-inverting input terminal of the second operational transconductance amplifier being coupled to a reference voltage; and a third operational transconductance amplifier having a transconductance $g_{m3}$, a third inverting input terminal, a third non-inverting input terminal, and a third output terminal, the second output terminal of the second operational transconductance amplifier being coupled to the third non-inverting input terminal of the third operational transconductance amplifier and the first inverting input terminal of the first operational transconductance amplifier, the third output terminal of the third operational transconductance amplifier being coupled to the first output terminal of the first operational transconductance amplifier and the second inverting input terminal of the second operational transconductance amplifier, and the third inverting input terminal of the third operational transconductance amplifier being coupled to the reference voltage, wherein an input signal applied to the first operational transconductance amplifier results in an output signal at the second output terminal of the second operational transconductance amplifier with an amplitude $g_{m1}/(g_{m3}-g_{m1})$ times the input signal.

7. The resistorless amplifier circuit according to claim 6 wherein the input signal is a voltage difference between the first non-inverting input terminal and the reference voltage, the resistorless amplifier circuit generating the output signal with the amplitude $g_{m1}/(g_{m3}-g_{m1})$ times the input signal and inverted phase.

* * * * *